(12) United States Patent
Mirichigni et al.

(10) Patent No.: US 11,887,688 B2
(45) Date of Patent: Jan. 30, 2024

(54) TECHNIQUES FOR INDICATING ROW ACTIVATION

(71) Applicant: Micron Technology, Inc., Boise, ID (US)

(72) Inventors: Graziano Mirichigni, Vimercate (IT); Efrem Bolandrina, Fiorano al Serio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/511,314

(22) Filed: Oct. 26, 2021

(65) Prior Publication Data
US 2023/0126944 A1 Apr. 27, 2023

(51) Int. Cl.
*G11C 7/10* (2006.01)
*G11C 8/18* (2006.01)

(52) U.S. Cl.
CPC ............ *G11C 7/1063* (2013.01); *G11C 7/109* (2013.01); *G11C 7/1048* (2013.01); *G11C 8/18* (2013.01)

(58) Field of Classification Search
CPC ................................ G11C 7/10; G11C 7/1063
USPC ...................................................... 365/230.06
See application file for complete search history.

(56) References Cited

U.S. PATENT DOCUMENTS

| | | | | | |
|---|---|---|---|---|---|
| 5,889,714 | A | * | 3/1999 | Schumann | G11C 7/1072 365/189.12 |
| 7,068,558 | B2 | * | 6/2006 | Cho | G11C 11/408 365/236 |
| 2003/0189870 | A1 | * | 10/2003 | Wilcox | G11C 11/408 365/189.18 |
| 2009/0282207 | A1 | * | 11/2009 | Burkart | G06F 12/0615 711/E12.003 |

(Continued)

FOREIGN PATENT DOCUMENTS

| TW | 202105378 A | 2/2021 |
|---|---|---|
| WO | 2011/049753 A1 | 4/2011 |
| WO | 2021/011132 A1 | 1/2021 |

OTHER PUBLICATIONS

"International Search Report and Written Opinion of the International Searching Authority," issued in connection with Int'l Appl. No. PCT/US2022/076275, dated Dec. 28, 2022 (11 pages).

(Continued)

*Primary Examiner* — Muna A Techane
(74) *Attorney, Agent, or Firm* — Holland & Hart LLP

(57) ABSTRACT

Methods, systems, and devices for techniques for indicating row activation are described. A memory device may receive an indication associated with an activation command, which may enable the memory device to begin some aspects of an activation operation before receiving the associated activation command. The indication may include a location of a next row to access as part of the activation command. The indication may be included in a previous activation command or in a precharge command. The memory device may (Continued)

begin activation operations for the next row before the precharge operation of the current row is complete. The memory device may receive the activation command for the next row after receiving the indication, and may complete the activation operations upon receiving the activation command.

15 Claims, 8 Drawing Sheets

(56) References Cited

U.S. PATENT DOCUMENTS

| | | | |
|---|---|---|---|
| 2011/0141836 A1* | 6/2011 | Luthra | G11C 11/40618 365/230.03 |
| 2014/0208156 A1 | 7/2014 | Muralimanohar et al. | |
| 2015/0309743 A1 | 10/2015 | Sohn et al. | |
| 2017/0364461 A1* | 12/2017 | Croxford | G06F 13/1673 |
| 2020/0402547 A1* | 12/2020 | Sharma | G11C 7/10 |
| 2021/0225418 A1 | 7/2021 | Kwon et al. | |
| 2021/0225433 A1 | 7/2021 | Kaminski et al. | |
| 2022/0013157 A1 | 1/2022 | Mirichigni et al. | |
| 2022/0406344 A1* | 12/2022 | Lee | G11C 8/06 |

OTHER PUBLICATIONS

Taiwanese Patent Office, "Office Action," issued in connection with Taiwan Patent Application No. 111136460 dated Oct. 27, 2023 (7 pages).

* cited by examiner

TECHNIQUES FOR INDICATING ROW ACTIVATION

FIELD OF TECHNOLOGY

The following relates generally to one or more systems for memory and more specifically to techniques for indicating row activation.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
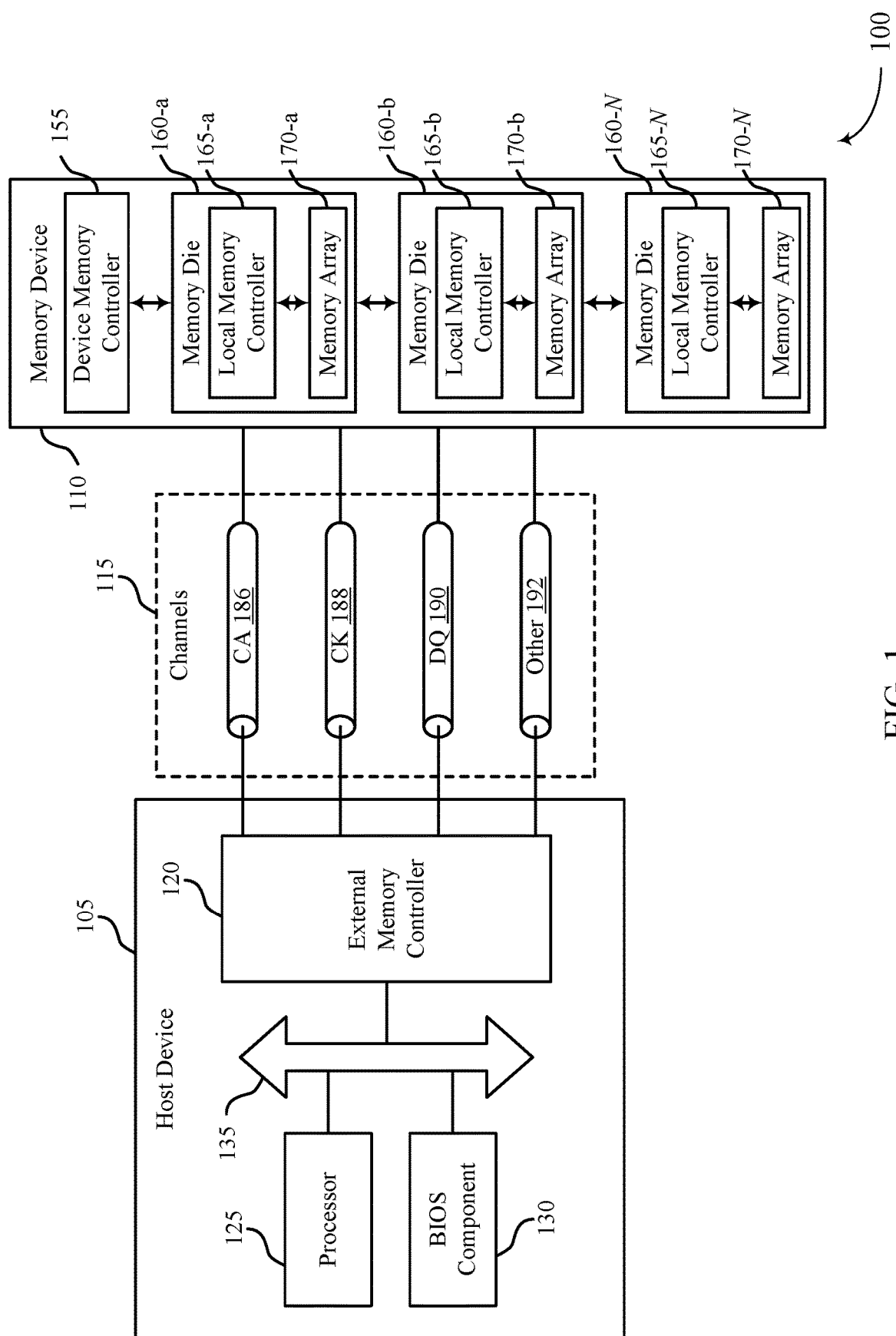
FIG. 1 illustrates an example of a system that supports techniques for indicating row activation in accordance with examples as disclosed herein.

To access a memory cell within a row of a subarray within a bank of a memory device (e.g., a random access memory (RAM) device), separate operations may be performed which may be triggered by separate, corresponding commands (e.g., sent by a host device or a controller of the host device) to the memory device. For example, the memory device may receive an activation command for a row of memory cells, which may trigger an activation operation. The activation operation may open a row of memory cells within a given subarray of a given bank. After the activation command, the memory device may receive a data access command (e.g., a read, a write, a program, a rewrite, etc.) directed to the opened row. Based on the data access command, the memory device may read data from or write data to one or more memory cells of the opened row. The memory device may then receive a precharge command directed at the opened row. Based on the precharge command, the memory device may close the opened row, which may lead to completion of the row access operation.

Each of the steps of the row access operations (e.g., activating, accessing, precharging) may have an associated latency. In some cases, memory devices may support timing signals (e.g., phases) associated with executing activation, data access, and precharge commands, which may trigger internal operations for accessing the memory cell within the row. In some cases, it may not be possible to initiate an activation operation to open a row of memory cells if a prior row access operation is still ongoing. For example, if the prior accessed row has not yet been closed (e.g., at the end of the precharge operation) then the memory device may be unable to access a different row or to access a different portion of memory at the already-opened row. The delay between completion of the precharge operation (e.g., closing one or more rows of memory cells) and an activation command for a subsequent row of memory cells may increase the amount of time for accessing cells within a memory device.

According to aspects as described herein, a memory device may receive an indication (e.g., a hint) associated with an activation command, which may be coming at a future time. The indication (e.g., hint) may enable the memory device to begin some aspects of the activation operation of a next row before the associated activation command is received. For example, the hint may include a location (e.g., a section index or a row address) of the next row to be accessed. In some cases, the location of the next row access operation may be in a same section of a bank or a different section of the bank as a current row being accessed (e.g., the current row access operation). In some cases, the indication (e.g., hint) may be included in a previous activation command or precharge command. For example, upon receiving the indication (e.g., hint) in a precharge command, the memory device may begin activation operations for the next row access operation before the precharge operation of the current row access operation is complete. The memory device may receive the activation command for the next row access operation after receiving the indication (e.g., hint), and may complete the activation operation in response to receiving the activation command. That is, the memory device may perform portions of the activation operation for the next row access operation during the precharge operations for the current row access operation. By performing portions of the activation operation early (e.g., before receiving the activation command), the memory device may reduce the overall latency of the access operation of the next row, and thus may improve performance at the memory device.

Features of the disclosure are initially described in the context of systems and dies as described with reference to FIGS. 1 and 2. Features of the disclosure are described in the context of a memory system and command timelines as described with reference to FIGS. 3-4. These and other features of the disclosure are further illustrated by and described with reference to apparatus diagrams and flowcharts that relate to techniques for indicating row activation as described with reference to FIGS. 5-8.

FIG. 1 illustrates an example of a system 100 that supports techniques for indicating row activation in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

In some examples, the host device may transmit multiple activation commands to the memory device 110 (e.g., via the external memory controller 105). For example, the host device may determine to access one or more rows of memory cells within the memory device 110 (e.g., within the same or different subarrays of the memory device 110, within the same or different banks of the memory device 110) and may transmit a first activation command to access a first row of memory cells and a second activation command to access a second row of memory cells. In some cases, the host device may be configured to include an indication (e.g., a hint) in a command that may include location information associated with the second activation command that comes later in time. The first and second rows may be in a same bank, or in some cases may be a same row. The host device may determine a time to transmit the second activation command based on several factors, including whether a hint was included in a previous command, and whether the first and second rows may be in a same subarray. According to some aspects, the host device may select between a default tRP or a tRP_S when determining a time for transmission of the second activation command. The host device may transmit the second activation command following transmission of the precharge command to the first row, with a delay that corresponds to the selected default tRP or tRP_S. In some cases, the transmitted hint may enable the memory device to shorten the tRCD associated with performing the activation operation.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

In some examples, a memory array 170 may include multiple memory banks, and each memory bank may include multiple subarrays. In some cases, each subarray may include multiple rows of memory cells, which may be accessible by an external device (e.g., a host device, external memory controller 105). A given subarray may include or utilize a corresponding latching circuit, which may allow the memory device 110 to maintain phases (e.g., timing signals associated with a row access operation) for a row of memory cells of the given subarray independent of phases for rows of memory cells in other subarrays, even other subarrays in the same bank.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory die 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The external memory controller 105 may be part of or associated with a host device and may send one or more commands to the memory device 110 via the CA bus 186. Each of the commands may have an associated latency. In some examples, the external memory controller may send an activation command to the memory device 110 to open a row of memory cells in a subarray followed by an access command to access the row of memory cells in the subarray, and a precharge command to close the row of memory cells in the subarray. In some cases, the external memory controller 105 may include a hint in one of the commands of a location of a subsequent activation command (e.g., an activation command for a second row of memory cells). The external memory controller 105 may determine to access the second row of memory cells (e.g., in a same or different subarray) and may determine a timing for sending subsequent commands based on having previously sent the hint. In some cases, determining the timing based on the hint may enable the system 100 to reduce overall latency of the row access operation.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

The channels 115 may include any quantity of signal paths (including a single signal path). In some examples, a channel 115 may include multiple individual signal paths. For example, a channel may be ×4 (e.g., including four signal paths), ×8 (e.g., including eight signal paths), ×16 (including sixteen signal paths), etc.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some examples, a multi-symbol (or multi-level) modulation scheme may be used to modulate signals communicated between the host device 105 and the memory device 110. A multi-symbol modulation scheme may be an example of a M-ary modulation scheme where M is greater than or equal to three. Each symbol of a multi-symbol modulation scheme may be operable to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., a PAM3 signal or a PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

Figure 2:
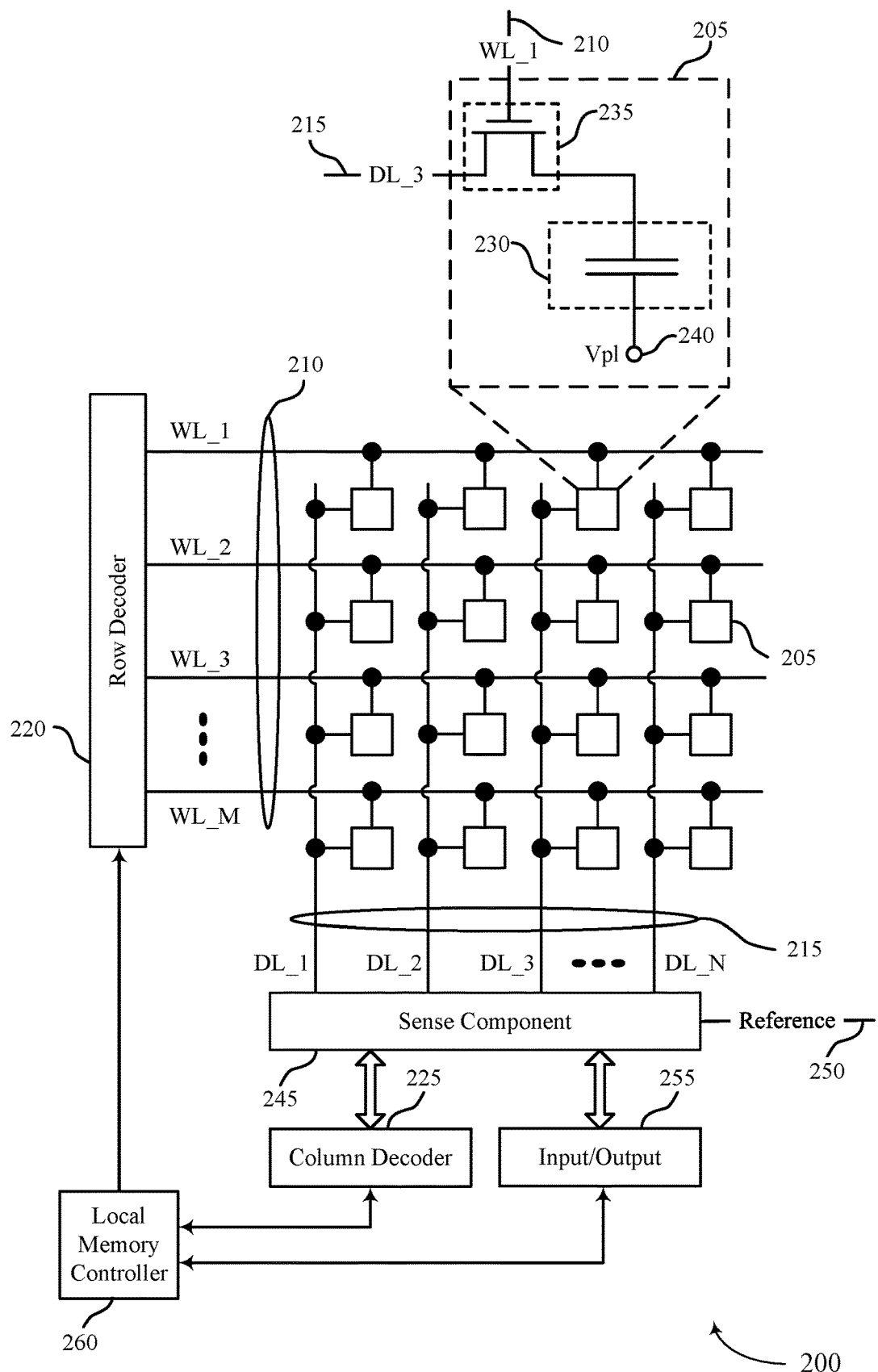
FIG. 2 illustrates an example of a memory die that supports techniques for indicating row activation in accordance with examples as disclosed herein.

FIG. 2 illustrates an example of a memory die 200 that supports techniques for indicating row activation in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

In some examples, a portion of memory cells 205 may be part of a row of memory cells 205 of a subarray of a memory bank. The row of memory cells 205 may be accessed (e.g., by a host device) through one or more commands. For example, the row of memory cells 205 may be opened based on an activation command. An access command (e.g., a read command or a write command) may access data stored on or write data to the row of memory cells 205, and the row of memory cells 205 may be closed based on a precharge command. In some examples, an indication of a location of a second activation command may be included in a previous command (e.g., a first activation command or a precharge command). Access to a second row of memory cells 205 may be initiated at an earlier time (e.g., before the second activation command is received) based on the indication.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

A word line 210 may be a conductive line in electronic communication with a memory cell 205 that is used to perform access operations on the memory cell 205. In some architectures, the word line 210 may be coupled with a gate of a switching component 235 of a memory cell 205 and may be operable to control the switching component 235 of the memory cell. In some architectures, the word line 210 may be coupled with a node of the capacitor of the memory cell 205 and the memory cell 205 may not include a switching component.

A digit line 215 may be a conductive line that connects the memory cell 205 with a sense component 245. In some architectures, the memory cell 205 may be selectively coupled with the digit line 215 during portions of an access operation. For example, the word line 210 and the switching component 235 of the memory cell 205 may be operable to couple and/or isolate the capacitor 230 of the memory cell 205 and the digit line 215. In some architectures, the memory cell 205 may be coupled with the digit line 215.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may transmit commands to the sense component 245 or the row decoder 220 to initiate a row access operation (e.g., by initiating a first activation operation to open a row). In some cases, the local memory controller 260 may transmit the commands based on a command from the host device 105 as described with reference to FIG. 1. In some cases, the local memory controller 260 may be configured to include an indication (e.g., a hint) in a command (e.g., a first activation command, a precharge command) associated with a location of a future activation command (e.g., a second activation command). Based on the hint, the sense component 245 or the row decoder 220 may initiate a second activation operation before a precharge operation may be complete.

In some cases, the memory controller 260 may include different information within the hint. For example, in some cases, the second activation operation may occur at a same or different section, and the hint may include the same or different section index. Additionally, the hint may include specific row address bit information. Depending on the information included in the hint and whether the second activation operation is at a same or different section, the tRCD associated with the second activation operation and data access operation may have a varying time period.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

Figure 3:
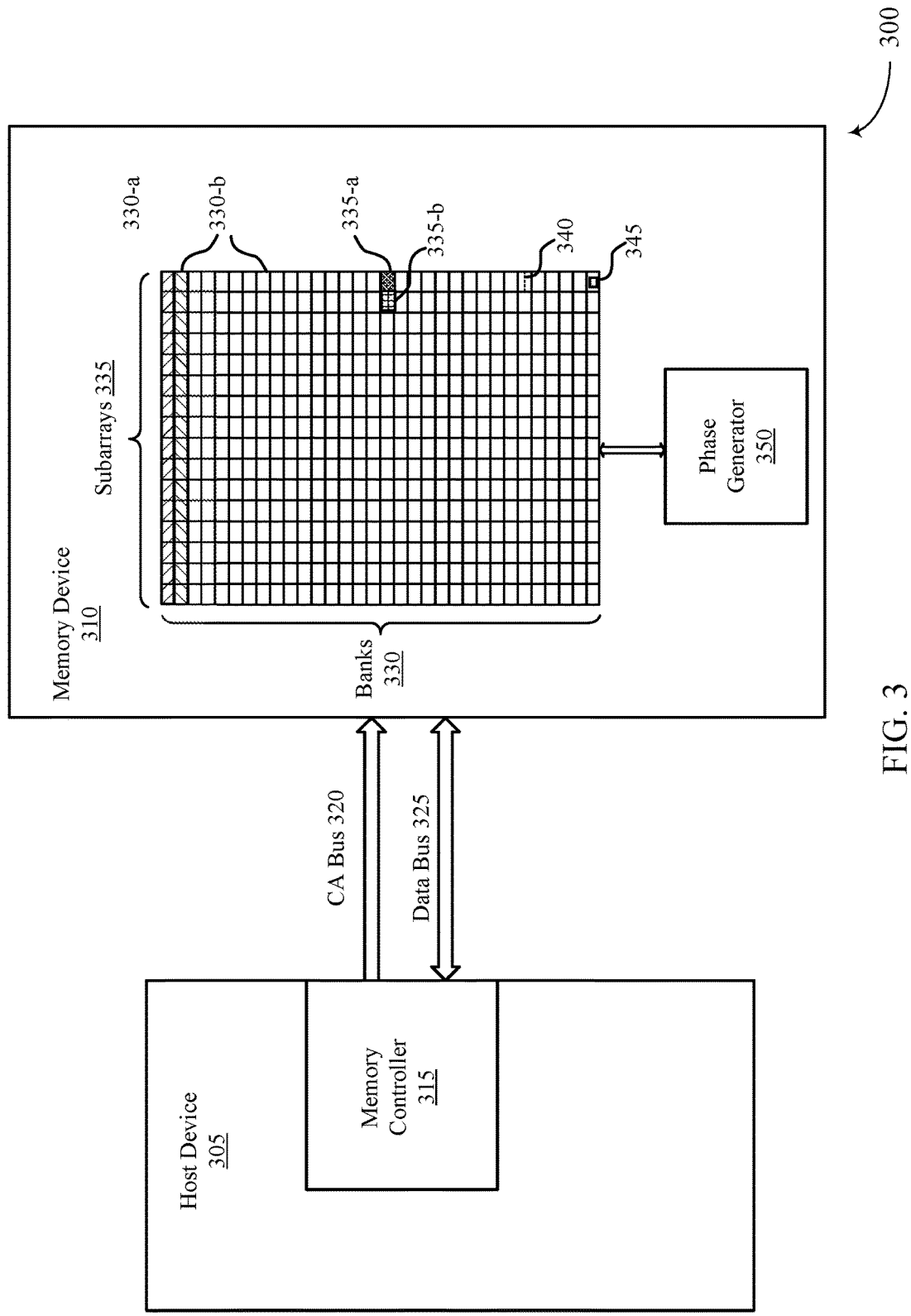
FIG. 3 illustrates an example of a memory system that supports techniques for indicating row activation in accordance with examples as disclosed herein.

FIG. 3 illustrates an example of a memory system 300 that supports techniques for indicating row activation in accordance with examples as disclosed herein. Memory system 300 may include host device 305 and memory device 310. Host device 305 may include memory controller 315 (which may be an example of an external memory controller as described with reference to FIG. 1), which may communicate with memory device 310 (which may be an example of a memory device 110 as described with reference to FIG. 1) through CA bus 320 or data bus 325. Memory device 310 may utilize DRAM, FeRAM, or other types of memory to store data at the memory device 310. The data stored in memory device 310 may be accessible by memory controller 315 and the process of accessing data stored at memory device 310 by memory controller 315 may be referred to as an access operation or a data access operation.

An access operation, such as a read or write operation, may be communicated (e.g., sent by the host device 305) to memory device 310 as a series of commands (e.g., as a command sequence). The commands may be communicated to memory device 310 by memory controller 315 over CA bus 320 (which may be an example of a CA bus 186). The commands may be received by memory device 310, and may trigger corresponding operations at a memory device 310 to read, write, or otherwise access data stored by the memory device 310 (e.g., at one or more memory cells of the memory device 310). The data stored at or written to the memory device 310 may be communicated between the host device 305 and the memory device 310 over data bus 325 (which may be an example of a DQ bus 190).

Memory device 310 may include multiple subarrays 335. The subarrays 335 may store data contained in memory device 310. Subarrays 335 may be grouped into banks 330. In some examples, memory device 310 may contain thirty-two banks 330, each of which may contain multiple subarrays 335 of memory cells. For instance, one or more banks 330 may contain sixteen subarrays 335. First subarray 335-*a* and second subarray 335-*b* may be examples of subarrays 335 and, as shown in this example, are located in the same bank 330 of memory device 310. The subarrays 335 may each contain individual rows of memory cells, such as row 340, that may store data associated with memory device 310 or may have data written thereto.

In some cases, a command received by the memory device 310 may cause the memory device 310 to generate one or more related phases (e.g., using phase generator 350). For example, for each activate, data access, or precharge command received by the memory device 310, the phase generator 350 of the memory device 310 may generate a related set of phases. The related set of phases may refer to or may include timing signals that collectively trigger or otherwise control sequences of internal operations within a subarray 335.

In some cases, a command received by the memory device 310 (e.g., a command transmitted over the CA bus 320) may include an indication (e.g., a hint) of a location of a subsequent row to be accessed by a future access operation. In some cases, the memory controller 315 may configure the command to include the indication. For example, in some cases, a first activation command associated with opening a row of a subarray 335 may include an indication that a second activation command may be associated with a different row of a same subarray 335. In some cases, a precharge command may include the indication. Upon receiving the indication, the phase generator 350 may generate a set of timing signals (e.g., one or more related phases) such that a portion of the second activation command may be executed before the precharge command may be completed, or before the second activation command may be received, or both.

Executing a commanded operation may include executing a collection of such internal operations (e.g., executing an activation operation at a subarray 335 may include executing a first collection of phase-controlled internal operations, executing an access operation such as a read or write operation at a subarray 335 may include executing a second collection of phase-controlled internal operations, and executing a precharge operation at a subarray 335 may include executing a third collection of phase-controlled internal operations). Thus, the phases may govern the internal timing of the access operations of a given row of a given subarray 335 to which the commands are directed. In some examples, the phases may be internal timing signals that trigger the electrical operations (e.g., the physical electrical operations) corresponding to the commanded operations on an individual row basis to access memory cells of a given row 340.

Row access operations and data access operations at the memory device 310 may each have an associated latency. For example, the latency of a row access operation may be associated with the internal timing of the data access operation, which may be associated with the set of timing signals generated at the phase generator 350. In some cases, the set of timing signals may include a tRCD (e.g., the minimum time between an activation command and a data access command), which may be longer due to increased latency associated with the activation command or the data access operation. To reduce the time associated with tRCD and improve overall latency, the phase generator 350 may be enabled to execute a portion of an activation operation while a precharge operation is underway, based on an indication included in a previous signal. For example, based on the indication of the location of the next row access operation, the phase generator 350 may execute a precharge operation at a row within the subarray 335-a while the phase generator 350 may also begin to execute an activation operation at a row within the subarray 335-b. In some cases, the phase generator 350 may execute a precharge operation at a row within the subarray 335-a while also beginning to execute an activation operation at portion of memory at the same row of the subarray 335-a. By enabling the phase generator 350 to generate timing signals allowing for the overlap between closing a row (e.g., executing the precharge command) and opening a next row (e.g., executing the next activation command) the memory device may improve latency and overall efficiency of system operations.

The memory device 310 may include any number of phase generators 350 (e.g., one per subarray 335, one per bank 330, one per memory die, or one per memory device 310). In some examples, subarray-level phases may enable parallel subarray operations. As one example, a phase generator 350 may be included in or include aspects of a device memory controller 155 or a local memory controller 165 included in the memory device 310. As another example, a phase generator 350 may include logic or other special-purpose circuitry, which may be included in, coupled with, or otherwise associated with the bank 330 targeted by the corresponding command (e.g., each bank 330 may include, be coupled with, or be otherwise associated with a respective phase generator 350)—that is, phases may be generated on a per-bank 330 basis. Phases and other signals generated within the memory device 310 but outside of a corresponding subarray 335 may include, be coupled with, or be otherwise associated with a respective phase generator 350, and phases may be generated locally for each subarray 335.

Global phases may be generated per bank 330. This may support different banks 330 being accessed concurrently (in parallel, with access to rows in different banks 330 at least partially overlapping in time). In some examples, an activation or precharge operation on a row 340 in a bank 330 may occur while an activation or precharge operation occurs on a row 340 in a different bank 330 in a memory device 310.

In some examples, each subarray 335 may include, use, or otherwise be associated with a corresponding (e.g., one corresponding) row buffer for accessing the data stored in the subarray 335. Additionally or alternatively, each subarray 335 within a bank 330 may include, use, or otherwise be associated with a corresponding latching circuit 345, which may duplicate phases associated with the subarray 335 and maintain (e.g., preserve, store) the phases independent of phases associated with the remaining subarrays 335 in the bank 330 or the memory device 310. For example, a latching circuit 345 may store duplicate versions (copies) of global phases or other signals associated with (e.g., for executing operations on) the corresponding subarray 335. The latching circuits 345 may enable improvement of memory system 300 in accordance with examples described herein. For example, this may support different subarrays 335 of a same bank being accessed concurrently (e.g., in parallel, with accesses to rows in different subarrays 335 of a same bank 330 at least partially overlapping in time). In some examples, an activation or precharge operation on a row 340 in a first subarray 335 of a bank 330 may occur while an activation or precharge operation occurs on a row 340 in a second subarray of the bank 330 in a memory device 310.

Accessing a row 340 may involve one or more operations, and each operation may contribute to the overall latency of accessing the row. Such operations may be based on (e.g., in response to) corresponding commands, which may be communicated by memory controller 315 to the memory device 310. The commands to access a row 340 within a subarray 335 in a bank 330 may include an activation command (e.g., corresponding to an activation operation), a data access command (e.g., corresponding to a read operation, a write operation, a program operation, a reset operation, a rewrite operation), and a precharge command (e.g., corresponding to an activation operation). The activation operation may open the row 340 of memory cells. The access operation may access the data contained in the opened (e.g., activated) row 340 (e.g., in the case of a read operation) or write data into the opened row 340 (e.g., in the case of a write operation). The precharge operation may close the opened row 340.

All three operations may be performed to access a row 340 of memory cells within a subarray 335 in a bank 330 of memory device 310. In some examples, the activation operation may be performed before an access operation to open the row 340. Additionally, the precharge operation may be performed to close the activated row 340. In some cases, a precharge operation may be performed before a subsequent access operation of a row 340 in the same bank 330. The corresponding commands may be communicated from memory controller 315 to memory device 310 as a series of commands (e.g., as a command sequence). The commands may include an activation command, a data access command, and a precharge command, and may be received in the order the corresponding operations are performed.

Figure 4A:
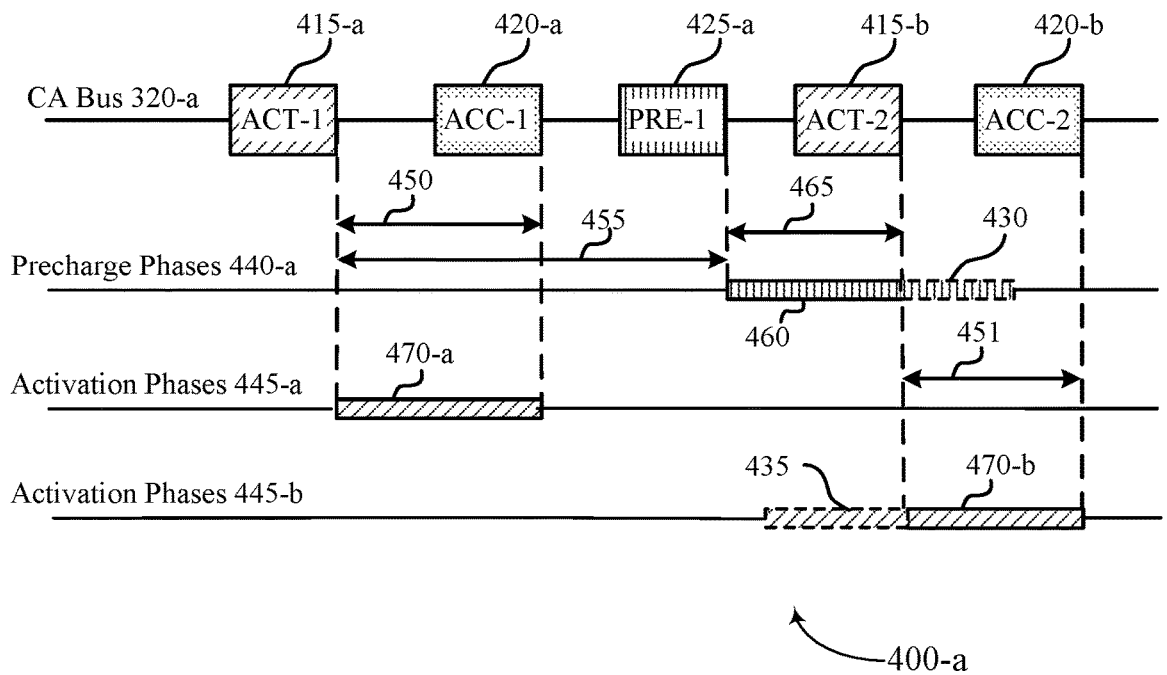
FIGS. 4A and 4B illustrates an example of a command timeline that supports techniques for indicating row activation in accordance with examples as disclosed herein.

FIG. 4A illustrates an example of a command timeline 400-a that supports techniques for indicating row activation in accordance with examples as disclosed herein. The command timeline 400-a may include a CA bus 320-a, which may be an example of a CA bus 320 as described with reference to FIG. 3. The command timeline 400-a illustrates an example where indication correctly identifies the next row that is accessed (e.g., a hint hit) and the first row and the second (subsequent) row are in different sections of the memory device.

The command timeline 400-a may include a number of commands associated with one or more row access operations, including a first activation command 415-a, a second activation command 415-b, a first data access command 420-a, a second data access command 420-b, and a precharge command 425-a. The command timeline 400-a may include a set of timing signals, including one or more precharge phases 440-a, one or more activation phases 445-a, and one or more activation phases 445-b. The precharge phases 440-a may include a precharge operation 460, which, in some cases, may include a hidden portion 430. The precharge operation 460 may be associated with a tRP 465 (e.g., a Row-Precharge time) and a tRAS 455 (e.g., Row-Active time). The activation phases 445-a may include an activation operation 470-a, which may be associated with a duration 450 (e.g., a standard tRCD, a row address to column address delay). In some cases, the duration 450 may be an amount of time (e.g., a minimum amount) the controller may wait before sending a data access command (e.g., the command 420-a, the command 420-b). The activation phases 445-b may include an activation operation 470-b, which may include a hidden portion 435. In some cases, the activation operation 470-b may be associated with a duration 451 (e.g., a shortened tRCD).

The tRAS 455 may be the duration (e.g., a number of clock cycles, which may be the minimum number of clock cycles) between the memory device 310 receiving the first activation command 415-a and the memory device 310 receiving the precharge command 425-a. The tRP may be the duration between the memory device receiving the precharge command 425-a and completion of the precharge operation 460. The tRCD may be the duration between the memory device 310 receiving the first activation command 415-a and the memory device 310 receiving the first data access command 420-a.

The command timeline 400-a may be an example of a "hint hit" scenario, in which the first activation command 415-a or the precharge command 425-a may include an indication (e.g., a "hint") of a location of the second activation command 415-b. In some examples, the hint may include more than one bit of information and a portion of the hint may be included in each of the first activation command 415-a and the precharge command 425-a. In some cases, the hint may enable the memory device (e.g., the memory device 310, as described with reference to FIG. 3) to begin the second activation operation 470-b while the precharge operation 460 is ongoing. In some cases, beginning the second activation operation 470-b early may reduce the duration 451 (e.g., a shortened tRCD), which may reduce the overall latency of the row access operation.

To initiate a row access operation, the memory device 310 may receive a first activation command 415-a over the CA bus 320-a, which may be sent from a memory controller. The first activation command 415-a may be associated with opening a first row of a subarray (e.g., a subarray 335 as described with reference to FIG. 3). The first activation command 415-a may trigger the activation phases 445-a, which may include timing or other signals for internal operations used to open the first row. For example, the activation phases 445-a may be generated by a phase generator (e.g., the phase generator 350 as described with reference to FIG. 3). The first activation operation 470-a may be executed over the duration 450 (e.g., a standard tRCD). In some cases, the memory controller may start a timer corresponding to the duration 450 (e.g., a standard tRCD) to determine when to send subsequent commands associated with the row access operation.

While the first row is open, the memory device 310 may receive a first data access command 420-a over the CA bus 320-a. For example, the first data access command may be a read command, a write command, or another type of data access command. The first data access command 420-a may include an instruction to access a portion of memory at the first row opened by the first activation operation 470-a. The first data access command 420-a may trigger additional phases, which may comprise timing or other signals for internal operations used to read, write, or otherwise access memory cells at the open row. The memory controller may start additional timers corresponding to the internal operations. The first data access command 420-a and any additional associated phases may occur after the duration 450 (e.g., a standard tRCD).

After completing the first data access operation, the memory device 310 may receive a precharge command 425-a. The precharge command 425-a may trigger precharge phases 440-a, which may include timing or other signals for internal operations used to close the first row (e.g., the precharge operation 460). In some cases, the precharge command 425-a may additionally include an indication (e.g., a hint) of the location (e.g., a row) of the second activation command 415-b. In some cases, the hint may include a section index (e.g., a row) that may be associated with the second activation command 415-b. In some cases, the hint may include specific row address bits associated with the second data access command. The hint may enable the memory device 310 to trigger the second set of activation phases 445-b before the precharge operation 460 is complete.

An overall latency for accessing a row may be reduced when a portion 435 of the second activation operation 470-b for the second row is performed during at least a portion of time that the precharge operation 460 for the first row is still being performed (e.g., portion 435 occurs at the same time that a portion of precharge operation 460 occurs). In such examples, the portion 435 of the second activation 470-b may occur before the memory system receives the second activation command 415-b based on receiving the hint. Overlapping (in time) aspects of these two operations may reduce the overall latency of accessing a row.

Similarly, overall latency for accessing a row may be further reduced when a portion 430 of the precharge operation 460 is performed during at least a portion of time that the second activation operation 470-b is still being performed (e.g., portion 430 occurs at the same time that a portion of the second activation 470-b occurs). In such examples, the portion 430 of the precharge operation 460 may occur after the memory system receives the second activation command 415-b. To enable reducing latency in such situations, the duration of the tRP may be adjusted. For example, the precharge operation may be completed (e.g., the first row closed) within the tRP 465 time period. In some cases, the memory controller may start a timer corresponding to the tRP 465 to determine when to send subsequent commands associated with the row access operation. In some cases, due to the time overlap (e.g., portion 430) between the precharge operation 460 and the second activation operation 470-*b*, there may be a portion 430 (e.g., a hidden portion) of the precharge operation 460 that may occur after the second activation command 415-*b* has been received. The hidden portion 430 may enable a reduction in the tRP 465 time period (e.g., a tRP_S). For example, the increased overlap between the precharge operation 460 and the second activation operation 470-*b* may result in a shorter tRP 465. In some cases, the memory controller may determine to start a shorter timer corresponding to the shorter tRP (e.g., tRP_S). For example, if the memory controller has previously included a hint in a command transmitted over the CA bus 320-*a*, the memory controller may determine to use a timer associated with the shorter tRP 465. In some cases, extending the precharge operation to reduce the tRP 465 may be referred to as a method for tRP improvement or reduction.

In some cases, the memory controller may use the shorter tRP (e.g., tRP_S) without having previously included a hint in a command. For example, if the next activation command 415 (e.g., a second activation command 415-*b*) is associated with a row in a different section, the memory controller may include the hidden portion 430 in the precharge operation 460 and thus enable the reduction in the tRP 465.

The second row associated with the second activation operation 470-*b* may be in the same section as the first row associated with the first activation operation 470-*a* or may be in a different section as the first row associated with the first activation operation 470-*a*. The duration of time that can be reduced in the overall latency may depend on whether the two rows are in the same sections or are in different sections. The memory device 310 may receive a second activation command 415-*b* over the CA bus 320, which may trigger the activation phases 445-*b*. The second activation command 415-*b* may be associated with opening a second row of a subarray, which may be the location indicated in the hint within the precharge command 425-*a*.

In some cases, the second location of the second activation operation 470-*b* may have a different section index (e.g., a different row) than the location of the first activation operation 470-*a*, as shown in the command timeline 400-*a*. The second activation operation 470-*b* may be completed within the duration 451 (e.g., a shortened tRCD), when no hint or indication is used. The hint within the precharge command 425-*a* may have already triggered portions of the activation phases 445-*b*. In such cases, a portion 435 of the second activation operation 470-*b* (e.g., a hidden portion) may be completed before the second activation command 415-*b* may be received (e.g., before the start of the duration 451). In such cases, the duration 451 may be shorter than a standard tRCD (e.g., the duration 450) that occurs when no indication or hint is used. For example, in some cases when the second activation operation 470-*b* occurs at a different section as the first activation operation 470-*a*, the tRCD may be a tRCD_DS (e.g., a tRCD for a different section), which may be shorter than a standard tRCD when no indication or hint is used.

In some cases, the second location of the second activation operation 470-*b* may have a same section index (e.g., a same row) as the location of the first activation operation 470-*a*. The hint within the precharge command 425-*a* may have already triggered portions of the activation phases 445-*b*. In such cases, a portion 435 of the second activation operation 470-*b* (e.g., a hidden portion) may be completed before the second activation command 415-*b* may be received (e.g., before the start of the duration 451). In such cases, the tRCD may be shorter than a standard tRCD that occurs when no indication or hint is used. For example, in some cases when the second activation operation 470-*b* occurs at a same section as the first activation operation 470-*a*, the tRCD may be a tRCD_SS (e.g., a tRCD for a same section), which may be shorter than a standard tRCD when no indication or hint is used. In some cases, the tRCD_DS for hints between different sections may be shorter than both a standard tRCD and shorter than the tRCD_SS for hints between same sections.

The duration of tRCD (e.g., standard tRCD, tRCD_SS, tRCD_DS) may be variable based on various conditions, such as whether two adjacent activation operations are access rows in different sections or in same sections of the memory array. Different durations for tRCD may also mean that durations for portion 435 may vary between different combinations of activation operations. In some cases, the duration of the portion 435 and tRCD may vary based on whether the rows are in the different sections, in the same section, other factors, or a combination thereof. For example, the duration of tRCD may vary based on the relative locations of different sections within the memory array.

The indication or the hint may include a various information about the location of the next row being accessed by the second activation operation 470-*b*. Examples of the different types of information included in the indication or hint may include an indication of whether the rows are in different sections or in the same section, an indication of the section index of the next row, one or more bits for the specific row address of the next row, or a combination thereof. If the hint indicates whether the next row is in the same section or a different section than the current, the hint may include two or more bits to indicate three or more states. The three or more states indicated by the hint may include a first state that indicates that no hint is communicated, a second state that the next row may be in the same section as the current row, or a third state that the next row may be in a different section as the current row. If the hint indicates the section index of the next row, the indication may use three or more bits to indicate that either no hint is communicated or the section index of the next row.

In some cases, the indication or hint may include specific or additional row address bits for the next row associated with the second activation operation 470-*b*. Such information in the hint may allow further reduction to the overall latency of the row access. For example, if the activation operation 470-*b* occurs in a same section, the duration of tRCD and portion 435 may vary based on the relative locations between the specific rows in the same section. In some examples, tRCD may be tRCD_SS*, which may be shorter than both a standard tRCD and a tRCD_SS for other row addresses. In some cases, if the hint includes specific row address bits and the activation operation occurs at a different section, the tRCD may be a tRCD_DS*, which may be shorter than a standard tRCD, a tRCD_SS, a tRCD_SS*, and a tRCD_DS. In some cases, the memory controller may select a value for a time and start a timer corresponding to the tRCD to determine when to send subsequent commands associated with the row access operation based on the specific row address included in the hint. In some cases, the memory controller may determine, based on the type of hint included in a prior command, what type of timer to set (e.g., one corresponding to a standard tRCD, tRCD_SS, tRCD_SS*, tRCD_DS, or tRCD_DS*).

Various combinations of information in the indication or hint may be used to achieve different latencies for the row activations. In some examples, a same/different indication may be used allow the memory controller to adjust durations of the portion 435 and tRCD. In some examples, a same/different indication may be used in combination with tRP adjustments to allow the memory controller to adjust durations of the portion 435, tRCD, the portion 430, and tRP. In some cases, the tRP adjustments may be unrelated to the same/different indication. In some examples, a same/different indication and one or more bits indicating the specific row address of the next row may be used allow the memory controller to adjust durations of the portion 435 and tRCD. In some examples, a same/different indication and one or more bits indicating the specific row address of the next row may be used in combination with tRP adjustments to allow the memory controller to durations of the portion 435, tRCD, the portion 430, and tRP. In some examples, a section index indication of the next row may be used allow the memory controller to adjust durations of the portion 435 and tRCD. In some examples, a section index indication of the next row may be used in combination with tRP adjustments to allow the memory controller to durations of the portion 435, tRCD, the portion 430, and tRP. In some examples, a section index indication of the next row and one or more bits indicating the specific row address of the next row may be used allow the memory controller to adjust durations of the portion 435 and tRCD. In some examples, a section index indication of the next row and one or more bits indicating the specific row address of the next row may be used in combination with tRP adjustments to allow the memory controller to durations of the portion 435, tRCD, the portion 430, and tRP.

While the second row is open, the memory device 310 may receive a second data access command 420-b over the CA bus 320-a. The second data access command 420-b may include an instruction to access a portion of memory at the second row opened by the second activation operation 470-b. The second data access command 420-b may trigger additional phases, which may include timing or other signals for internal operations used to read, write, or otherwise access memory cells at the open row. The second data access command 420-b and any additional associated phases may occur after the duration 451. In some cases, due to the portion 435 of the second activation operation 470-b occurring before the completion of the precharge operation 460, the duration 451 may be shorter than the duration 450. Thus, the hint included in the precharge command 425-a may enable a reduction in the overall time of the row access operation. In some cases, the hint may be included in the first activation command 415-a (e.g., instead of in the precharge command 425-a).

Figure 4B:
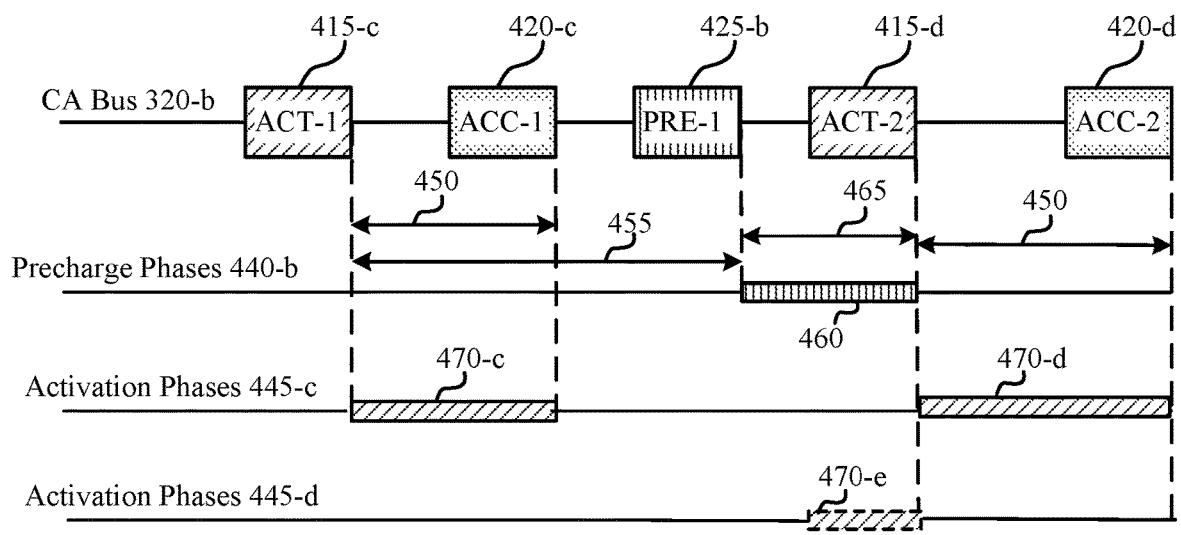

FIG. 4B illustrates an example of a command timeline 400-b that supports techniques for indicating row activation in accordance with examples as disclosed herein. The command timeline 400-b may include a CA bus 320-b, which may be an example of a CA bus 320 as described with reference to FIG. 3. The command timeline 400-b illustrates an example where indication incorrectly identifies the next row that is accessed (e.g., a hint miss).

The command timeline 400-b may include a number of commands associated with one or more row access operations, including a first activation command 415-c and a second activation command 415-d, a first data access command 420-c and a second data access command 420-d, and a precharge command 425-b. The command timeline 400-a may include a set of timing signals, including one or more precharge phases 440-b, one or more activation phases 445-c, and one or more activation phases 445-d. The precharge phases 440-b may include a precharge operation 460. The precharge operation 460 may be associated with a tRP 465 and a tRAS 455. The activation phases 445-c may include an activation operation 470-c, which may be associated with a duration 450 (e.g., a standard tRCD), and an activation operation 470-d, which may be associated with a duration 450 (e.g., a standard tRCD). The activation phases 445-d may include a portion of an activation operation 470-e.

The command timeline 400-b may be an example of a "hint miss" scenario, in which the first activation command 415-c or the precharge command 425-b may include an indication (e.g., a "hint") of a location of the second activation command 415-d, but that indication may not match with the second activation command 415-d. In such cases, the memory device may begin performing portions of the second activation operation 470-e based on the hint, but then have to cease such operation to perform the second activation operation 470-d after receiving the second activation command 415-d. In some cases, the hint may enable the memory device 310 to begin a portion of the activation operation 470-e while the precharge operation 460 is ongoing. In some cases, executing a portion of the activation operation 470-e may not impact the duration 450 (e.g., a standard tRCD), because the hint may not match the activation command 470-d.

To initiate a row access operation, the memory device 310 may receive the first activation command 415-c over the CA bus 320-b, which may be sent from the memory controller. The first activation command 415-c may be associated with opening a first row of a subarray. The first activation command 415-c may trigger the activation phases 445-c, which may include timing or other signals for internal operations used to open the first row. The first activation operation 470-c may be executed over the duration 450. In some cases, the memory controller may start a timer corresponding to the duration 450 to determine when to send subsequent commands associated with the row access operation.

While the first row is open, the memory device 310 may receive a first data access command 420-c over the CA bus 320-b. The first data access command 420-c may include an instruction to access a portion of memory at the first row opened by the first activation operation 470-c. The first data access command 420-c may trigger additional phases, which may include timing or other signals for internal operations used to read, write, or otherwise access memory cells at the open row. The memory controller may start additional timers corresponding to the internal operations. The first data access command 420-c and any additional associated phases may occur after the duration 450.

After completing the first data access operation, the memory device 310 may receive a precharge command 425-b. The precharge command 425-b may trigger precharge phases 440-b, which may include timing or other signals for internal operations used to close the first row (e.g., the precharge operation 460). In some cases, the precharge command 425-b may include an indication (e.g., a hint) of the location of the second activation command 415-d. In some cases, the hint may include an indication of whether the section of the second row is different than or the same as the section of the current row, a section index (e.g., a row) that may be associated with the second activation command 415-*d*, specific row address bits associated with the second data access command 415-*d*, or a combination thereof. The hint may enable the memory device 310 to trigger the second set of activation phases 445-*d* before the precharge operation 460 is complete. For example, in some cases, the memory device 310 may execute a portion of the activate command 470-*e* (e.g., may begin to open a second row) based on the hint.

In some cases, as described with reference to FIG. 4A, the memory controller may determine to use a shorter tRP (e.g., tRP_S) without having previously included a hint in a command. For example, if the next activation command (e.g., a second activation command 415-*d*) is associated with a row in a different section, the memory controller may include a hidden portion (e.g., the hidden portion 430 as shown in FIG. 4A) in the precharge operation 460 and thus enable a reduction in the tRP 465.

The memory device 310 may receive a second activation command 415-*d* over the CA bus 320-*b*. The second activation command 415-*d* may be associated with opening a second row of a subarray, which may not be the location indicated in the hint within the precharge command 425-*b*. In response to receiving the second activation command 415-*d* that includes a different location than the hint, the memory device may cease the operations associated with the second activation operation 470-*e* (as indicated by the hint) and may begin operation associated with the second activation operation 470-*d* (as indicated in the second activation command 415-*d*).

There may be several examples of situations that may result in a "hint miss," as shown in FIG. 4B. In some examples, the hint may indicate that the next row is in the same section as the current row and the second activation command 415-*d* may indicate that the next row is in a different section as the current row. In some examples, the hint may indicate that the next row is in a different section as the current row and the second activation command 415-*d* may indicate that the next row is in the same section as the current row. In some examples, the hint may indicate that a second index for the next row that is different than the section index indicated in the second activation command 415-*d*. In some examples, the hint may indicate one or more row address bits for the next row that do not match the row address indicated in the second activation command 415-*d* may indicate that the next row is in the same section as the current row. Other examples of cache misses are also possible, including any combination of the examples described herein.

In some cases, the second activation command 415-*d* may have a different section index (e.g., a different row) than the first activation operation 415-*c*. In some cases, the second activation command 415-*d* may have a same section index (e.g., a same row) as the first activation operation 415-*c*, as shown in the command timeline 400-*b*. The second activation command 415-*d* may trigger the activation phases 445-*c*, which may include timing or other signals for internal operations used to open the second row (e.g., the second activation operation 470-*d*). Because the portion of the activation command 470-*d* may have been executed at a row that may not match the second activation command 415-*d*, the memory device 310 may have to perform the full activation operation 470-*d* at the correct row (e.g., the row indicated by the second activation command 415-*d*). Thus, the duration 450 associated with the second activation operation 470-*d* may be the standard tRCD. In some cases, the memory controller may start a timer corresponding to the duration 450 to determine when to send subsequent commands associated with the row access operation.

In some cases, the memory device may reduce tRP based on overlapping a portion of the pre-charge operation 460 with a portion of the second activation command. In some cases of a hint miss and tRP reduction, the memory device may revert to a standard tRP duration for the tRP timer and complete the precharge operation 460 before executing the second activation operation 470-*d* indicated by the second activation command 415-*d*. In some cases of a hint miss, the memory device may maintain the shorter tRP (e.g., the tRP_S).

While the second row is open, the memory device 310 may receive a second data access command 420-*d* over the CA bus 320-*b*. The second data access command 420-*d* may include an instruction to access a portion of memory at the second row opened by the second activation operation 470-*d*. The second data access command 420-*d* may trigger additional phases, which may include timing or other signals for internal operations used to read, write, or otherwise access memory cells at the open row. The second data access command 420-*d* and any additional associated phases may occur after the duration 450. In some cases, the duration 450 may be longer than the duration 451, as described with reference to FIG. 4A, due to the mismatch between the hint and the second activation command 415-*d*.

Figure 5:
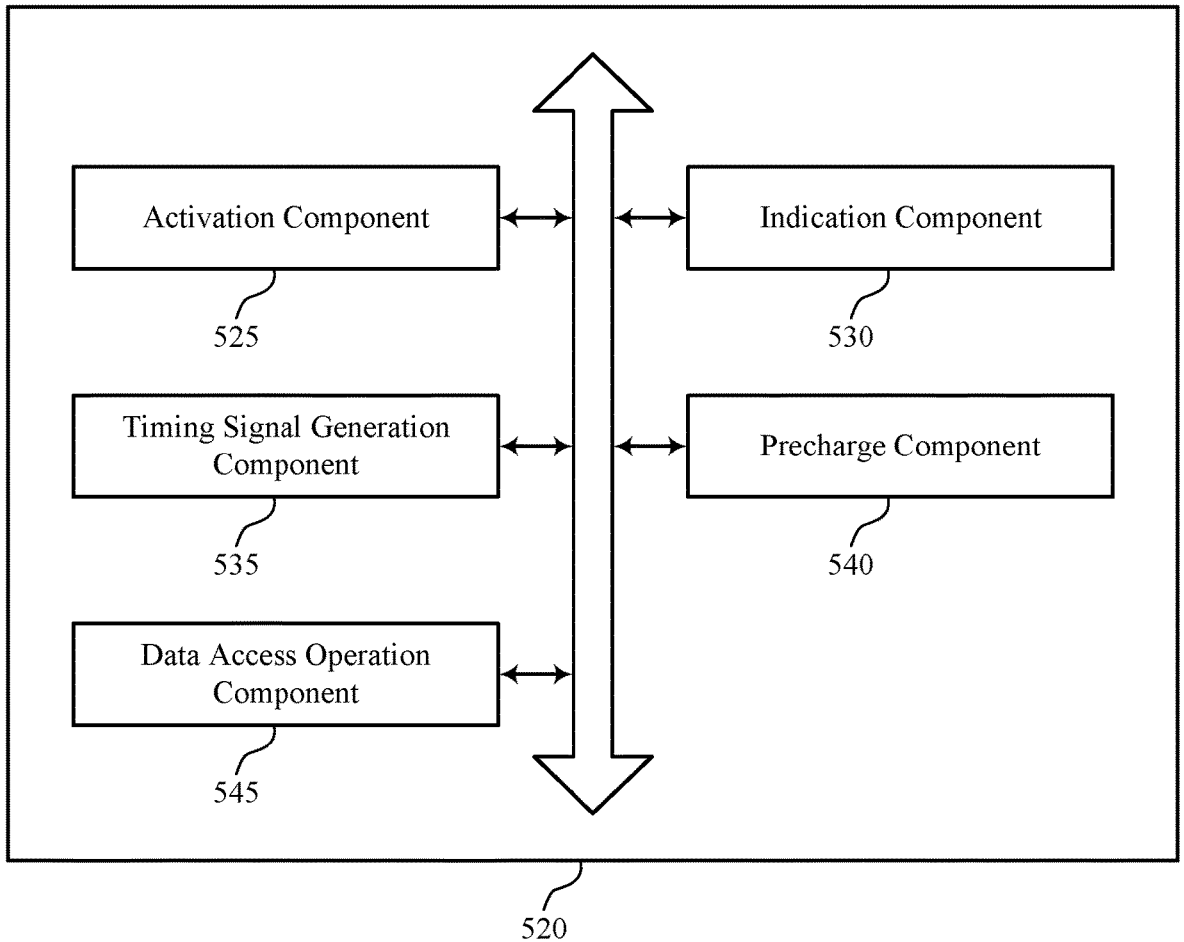
FIG. 5 shows a block diagram of a memory device that supports techniques for indicating row activation in accordance with examples as disclosed herein.

FIG. 5 shows a block diagram 500 of a memory device 520 that supports techniques for indicating row activation in accordance with examples as disclosed herein. The memory device 520 may be an example of aspects of a memory device as described with reference to FIGS. 1 through 4. The memory device 520, or various components thereof, may be an example of means for performing various aspects of techniques for indicating row activation as described herein. For example, the memory device 520 may include an activation component 525, an indication component 530, a timing signal generation component 535, a precharge component 540, a data access operation component 545, or any combination thereof. Each of these components may communicate, directly or indirectly, with one another (e.g., via one or more buses).

The activation component 525 may be configured as or otherwise support a means for receiving a first activation command to open a first row of memory cells in a first subarray of a bank of a memory device. The indication component 530 may be configured as or otherwise support a means for receiving an indication of a second activation command for a second subarray of the bank based at least in part on receiving the first activation command and before receiving the second activation command. In some examples, the activation component 525 may be configured as or otherwise support a means for activating a portion of the second subarray of the bank based at least in part on receiving the indication. In some examples, the activation component 525 may be configured as or otherwise support a means for receiving the second activation command to open a second row of memory cells in the second subarray of the bank after activating the portion of the second subarray.

In some examples, the second subarray includes the first subarray, and the timing signal generation component 535 may be configured as or otherwise support a means for generating, based at least in part on receiving the first activation command, a first set of timing signals to activate the first subarray of the bank. In some examples, the second subarray includes the first subarray, and the timing signal generation component 535 may be configured as or otherwise support a means for generating, based at least in part on receiving the indication and before receiving the second activation command, a second set of timing signals to activate the first subarray of the bank.

In some examples, the data access operation component 545 may be configured as or otherwise support a means for receiving a read command an amount of time after receiving the second activation command, the amount of time including a same section index shortened row address to column address delay (tRCD_SS) that is less than a default row address to column address delay (tRCD).

In some examples, the second subarray is different than the first subarray, and the timing signal generation component 535 may be configured as or otherwise support a means for generating, based at least in part on receiving the first activation command, a first set of timing signals to activate the first subarray of the bank. In some examples, the second subarray is different than the first subarray, and the timing signal generation component 535 may be configured as or otherwise support a means for generating, based at least in part on receiving the indication and before receiving the second activation command, a second set of timing signals to activate the second subarray of the bank.

In some examples, the data access operation component 545 may be configured as or otherwise support a means for receiving a read command an amount of time after receiving the second activation command, the amount of time including a different section index shortened row address to column address delay (tRCD_DS) that is less than a default row address to column address delay (tRCD).

In some examples, the precharge component 540 may be configured as or otherwise support a means for receiving, before receiving the second activation command, a precharge command to close the first row of memory cells.

In some examples, the indication is received in the precharge command.

In some examples, the second activation command is received before the first row of memory cells in the first subarray of the bank is closed.

In some examples, the second activation command is received an amount of time after the precharge command is received, the amount of time including a shortened row precharge time (tRP_S) that is less than a default row precharge time (tRP).

In some examples, the timing signal generation component 535 may be configured as or otherwise support a means for generating, based at least in part on receiving the precharge command, a set of timing signals to close the first row of memory cells. In some examples, the timing signal generation component 535 may be configured as or otherwise support a means for maintaining the set of timing signals after receiving the second activation command. In some examples, the precharge component 540 may be configured as or otherwise support a means for closing the first row of memory cells after receiving the second activation command based at least in part on maintaining the set of timing signals.

In some examples, the activation component 525 may be configured as or otherwise support a means for receiving a second indication of a third activation command for a third subarray of the bank based at least in part on receiving the second activation command and before receiving the third activation command. In some examples, the activation component 525 may be configured as or otherwise support a means for activating a portion of the third subarray of the bank based at least in part on receiving the second indication. In some examples, the activation component 525 may be configured as or otherwise support a means for receiving the third activation command to open a third row of memory cells in a fourth subarray of the bank after activating the portion of the third subarray, where the third subarray is different than the fourth subarray.

In some examples, the data access operation component 545 may be configured as or otherwise support a means for receiving a read command an amount of time after receiving the third activation command, the amount of time including a default row address to column address delay (tRCD).

In some examples, the indication is received in the first activation command.

In some examples, the indication includes one or more bits indicating a section index, one or more bits indicating a row address, or both.

Figure 6:
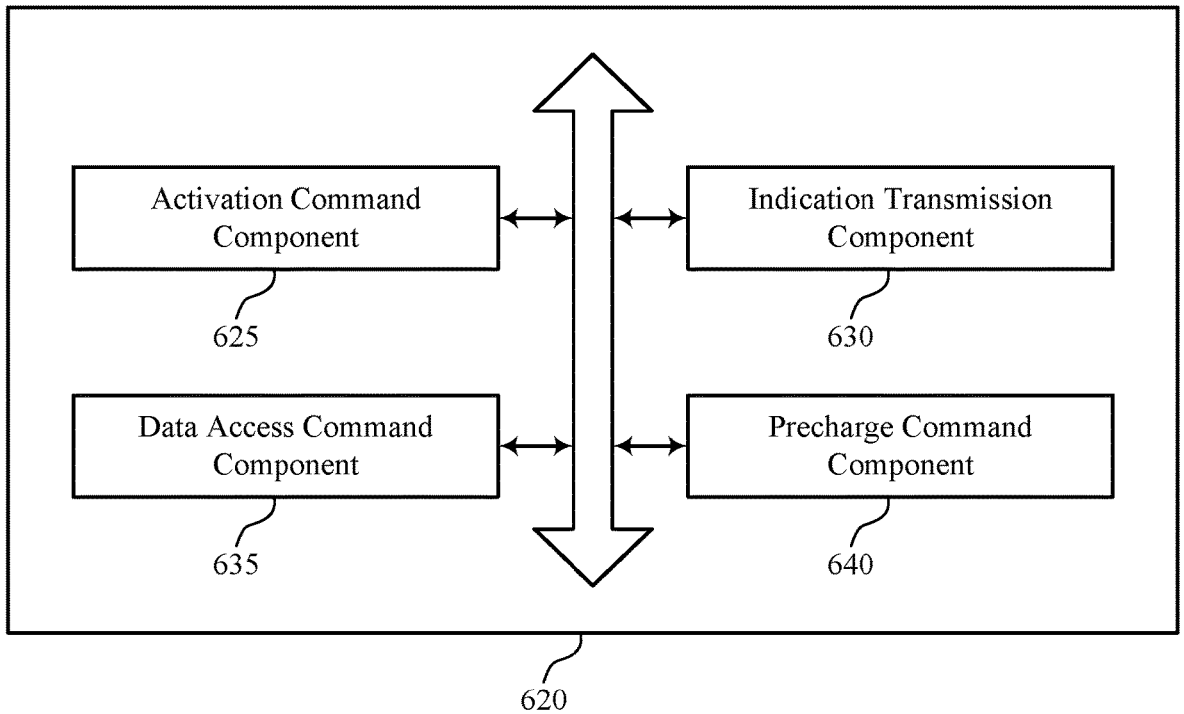
FIG. 6 shows a block diagram of a host device that supports techniques for indicating row activation in accordance with examples as disclosed herein.

FIG. 6 shows a block diagram 600 of a host device 620 that supports techniques for indicating row activation in accordance with examples as disclosed herein. The host device 620 may be an example of aspects of a host device as described with reference to FIGS. 1 through 4. The host device 620, or various components thereof, may be an example of means for performing various aspects of techniques for indicating row activation as described herein. For example, the host device 620 may include an activation command component 625, an indication transmission component 630, a data access command component 635, a precharge command component 640, or any combination thereof. Each of these components may communicate, directly or indirectly, with one another (e.g., via one or more buses).

The activation command component 625 may be configured as or otherwise support a means for transmitting a first activation command to open a first row of memory cells in a first subarray of a bank of a memory device. The indication transmission component 630 may be configured as or otherwise support a means for transmitting an indication of a second activation command for a second subarray of the bank based at least in part on transmitting the first activation command and before transmitting the second activation command. In some examples, the activation command component 625 may be configured as or otherwise support a means for transmitting the second activation command to open a second row of memory cells in the second subarray of the bank.

In some examples, the second subarray includes the first subarray, and the data access command component 635 may be configured as or otherwise support a means for transmitting a read command an amount of time after transmitting the second activation command, the amount of time including a same section index shortened row address to column address delay (tRCD_SS) that is less than a default row address to column address delay (tRCD).

In some examples, the second subarray is different than the first subarray, and the data access command component 635 may be configured as or otherwise support a means for transmitting a read command an amount of time after transmitting the second activation command, the amount of time including a different section index shortened row address to column address delay (tRCD_DS) that is less than a default row address to column address delay (tRCD).

In some examples, the precharge command component 640 may be configured as or otherwise support a means for transmitting, before transmitting the second activation command, a precharge command to close the first row of memory cells.

In some examples, the indication is transmitted in the precharge command.

In some examples, the second activation command is transmitted before the first row of memory cells in the first subarray of the bank is closed.

In some examples, the second activation command, which may be associated with a different section than the first activation command, is transmitted an amount of time after the precharge command is transmitted, the amount of time including a shortened row precharge time (tRP_S) that is less than a default row precharge time (tRP).

In some examples, the activation command component 625 may be configured as or otherwise support a means for transmitting a second indication of a third activation command for a third subarray of the bank based at least in part on transmitting the second activation command and before transmitting the third activation command. In some examples, the activation command component 625 may be configured as or otherwise support a means for transmitting the third activation command to open a third row of memory cells in a fourth subarray of the bank, where the third subarray is different than the fourth subarray.

In some examples, the data access command component 635 may be configured as or otherwise support a means for transmitting a read command an amount of time after transmitting the third activation command, the amount of time including a default row address to column address delay (tRCD).

In some examples, the indication is transmitted in the first activation command. In some examples, the indication includes one or more bits indicating a section index, one or more bits indicating a row address, or both.

Figure 7:
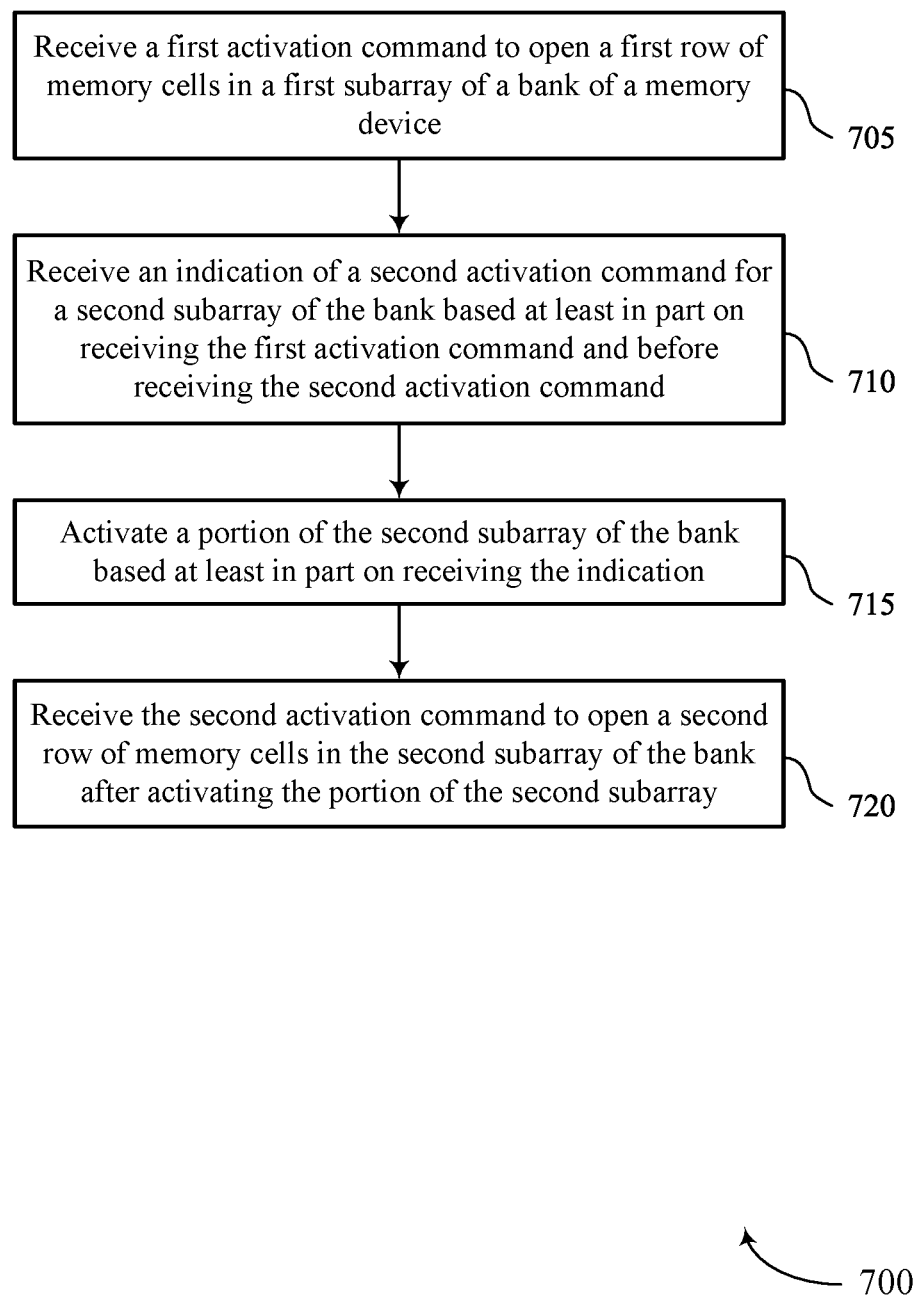
FIGS. 7 and 8 show flowcharts illustrating a method or methods that support techniques for indicating row activation in accordance with examples as disclosed herein.

FIG. 7 shows a flowchart illustrating a method 700 that supports techniques for indicating row activation in accordance with examples as disclosed herein. The operations of method 700 may be implemented by a memory device or its components as described herein. For example, the operations of method 700 may be performed by a memory device as described with reference to FIGS. 1 through 5. In some examples, a memory device may execute a set of instructions to control the functional elements of the device to perform the described functions. Additionally or alternatively, the memory device may perform aspects of the described functions using special-purpose hardware.

At 705, the method may include receiving a first activation command to open a first row of memory cells in a first subarray of a bank of a memory device. The operations of 705 may be performed in accordance with examples as disclosed herein. In some examples, aspects of the operations of 705 may be performed by an activation component 525 as described with reference to FIG. 5.

At 710, the method may include receiving an indication of a second activation command for a second subarray of the bank based at least in part on receiving the first activation command and before receiving the second activation command. The operations of 710 may be performed in accordance with examples as disclosed herein. In some examples, aspects of the operations of 710 may be performed by an indication component 530 as described with reference to FIG. 5.

At 715, the method may include activating a portion of the second subarray of the bank based at least in part on receiving the indication. The operations of 715 may be performed in accordance with examples as disclosed herein. In some examples, aspects of the operations of 715 may be performed by an activation component 525 as described with reference to FIG. 5.

At 720, the method may include receiving the second activation command to open a second row of memory cells in the second subarray of the bank after activating the portion of the second subarray. The operations of 720 may be performed in accordance with examples as disclosed herein. In some examples, aspects of the operations of 720 may be performed by an activation component 525 as described with reference to FIG. 5.

In some examples, an apparatus as described herein may perform a method or methods, such as the method 700. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for receiving a first activation command to open a first row of memory cells in a first subarray of a bank of a memory device; receiving an indication of a second activation command for a second subarray of the bank based at least in part on receiving the first activation command and before receiving the second activation command; activating a portion of the second subarray of the bank based at least in part on receiving the indication; and receiving the second activation command to open a second row of memory cells in the second subarray of the bank after activating the portion of the second subarray.

Aspect 2: The apparatus of aspect 1 where the second subarray includes the first subarray and the method, apparatuses, and non-transitory computer-readable medium, further includes operations, features, circuitry, logic, means, or instructions, or any combination thereof for generating, based at least in part on receiving the first activation command, a first set of timing signals to activate the first subarray of the bank and generating, based at least in part on receiving the indication and before receiving the second activation command, a second set of timing signals to activate the first subarray of the bank.

Aspect 3: The apparatus of aspect 2, further including operations, features, circuitry, logic, means, or instructions, or any combination thereof for receiving a read command an amount of time after receiving the second activation command, the amount of time including a same section index shortened row address to column address delay (tRCD_SS) that is less than a default row address to column address delay (tRCD).

Aspect 4: The apparatus of any of aspects 1 through 3 where the second subarray is different than the first subarray and the method, apparatuses, and non-transitory computer-readable medium, further includes operations, features, circuitry, logic, means, or instructions, or any combination thereof for generating, based at least in part on receiving the first activation command, a first set of timing signals to activate the first subarray of the bank and generating, based at least in part on receiving the indication and before receiving the second activation command, a second set of timing signals to activate the second subarray of the bank.

Aspect 5: The apparatus of aspect 4, further including operations, features, circuitry, logic, means, or instructions, or any combination thereof for receiving a read command an amount of time after receiving the second activation command, the amount of time including a different section index shortened row address to column address delay (tRCD_DS) that is less than a default row address to column address delay (tRCD).

Aspect 6: The apparatus of any of aspects 1 through 5, further including operations, features, circuitry, logic, means, or instructions, or any combination thereof for receiving, before receiving the second activation command, a precharge command to close the first row of memory cells.

Aspect 7: The apparatus of aspect 6, further including operations, features, circuitry, logic, means, or instructions, or any combination thereof for the indication is received in the precharge command.

Aspect 8: The apparatus of any of aspects 6 through 7, further including operations, features, circuitry, logic, means, or instructions, or any combination thereof for the second activation command is received before the first row of memory cells in the first subarray of the bank is closed.

Aspect 9: The apparatus of aspect 8, further including operations, features, circuitry, logic, means, or instructions, or any combination thereof for the second activation command is received an amount of time after the precharge command is received, the amount of time including a shortened row precharge time (tRP_S) that is less than a default row precharge time (tRP).

Aspect 10: The apparatus of any of aspects 8 through 9, further including operations, features, circuitry, logic, means, or instructions, or any combination thereof for generating, based at least in part on receiving the precharge command, a set of timing signals to close the first row of memory cells; maintaining the set of timing signals after receiving the second activation command; and closing the first row of memory cells after receiving the second activation command based at least in part on maintaining the set of timing signals.

Aspect 11: The apparatus of any of aspects 1 through 10, further including operations, features, circuitry, logic, means, or instructions, or any combination thereof for receiving a second indication of a third activation command for a third subarray of the bank based at least in part on receiving the second activation command and before receiving the third activation command; activating a portion of the third subarray of the bank based at least in part on receiving the second indication; and receiving the third activation command to open a third row of memory cells in a fourth subarray of the bank after activating the portion of the third subarray, where the third subarray is different than the fourth subarray.

Aspect 12: The apparatus of aspect 11, further including operations, features, circuitry, logic, means, or instructions, or any combination thereof for receiving a read command an amount of time after receiving the third activation command, the amount of time including a default row address to column address delay (tRCD).

Aspect 13: The apparatus of any of aspects 1 through 12, further including operations, features, circuitry, logic, means, or instructions, or any combination thereof for the indication is received in the first activation command.

Aspect 14: The apparatus of any of aspects 1 through 13, further including operations, features, circuitry, logic, means, or instructions, or any combination thereof for the indication includes one or more bits indicating a section index, one or more bits indicating a row address, or both.

Figure 8:
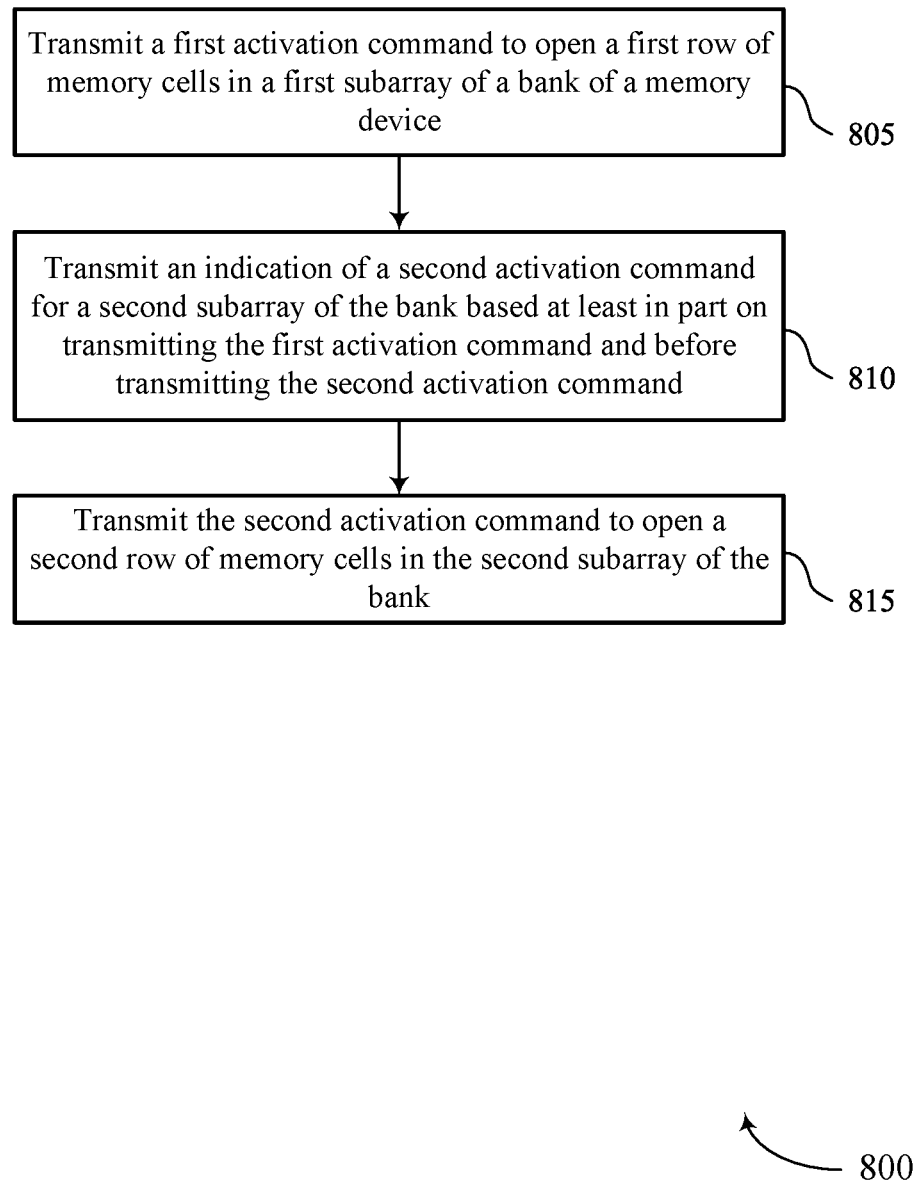

FIG. 8 shows a flowchart illustrating a method 800 that supports techniques for indicating row activation in accordance with examples as disclosed herein. The operations of method 800 may be implemented by a host device or its components as described herein. For example, the operations of method 800 may be performed by a host device as described with reference to FIGS. 1 through 4 and 6. In some examples, a host device may execute a set of instructions to control the functional elements of the device to perform the described functions. Additionally or alternatively, the host device may perform aspects of the described functions using special-purpose hardware.

At 805, the method may include transmitting a first activation command to open a first row of memory cells in a first subarray of a bank of a memory device. The operations of 805 may be performed in accordance with examples as disclosed herein. In some examples, aspects of the operations of 805 may be performed by an activation command component 625 as described with reference to FIG. 6.

At 810, the method may include transmitting an indication of a second activation command for a second subarray of the bank based at least in part on transmitting the first activation command and before transmitting the second activation command. The operations of 810 may be performed in accordance with examples as disclosed herein. In some examples, aspects of the operations of 810 may be performed by an indication transmission component 630 as described with reference to FIG. 6.

At 815, the method may include transmitting the second activation command to open a second row of memory cells in the second subarray of the bank. The operations of 815 may be performed in accordance with examples as disclosed herein. In some examples, aspects of the operations of 815 may be performed by an activation command component 625 as described with reference to FIG. 6.

In some examples, an apparatus as described herein may perform a method or methods, such as the method 800. The apparatus may include, features, circuitry, logic, means, or instructions (e.g., a non-transitory computer-readable medium storing instructions executable by a processor), or any combination thereof for performing the following aspects of the present disclosure:

Aspect 15: The apparatus, including features, circuitry, logic, means, or instructions, or any combination thereof for transmitting a first activation command to open a first row of memory cells in a first subarray of a bank of a memory device; transmitting an indication of a second activation command for a second subarray of the bank based at least in part on transmitting the first activation command and before transmitting the second activation command; and transmitting the second activation command to open a second row of memory cells in the second subarray of the bank.

Aspect 16: The apparatus of aspect 15 where the second subarray includes the first subarray and the method, apparatuses, and non-transitory computer-readable medium, further includes operations, features, circuitry, logic, means, or instructions, or any combination thereof for transmitting a read command an amount of time after transmitting the second activation command, the amount of time including a same section index shortened row address to column address delay (tRCD_SS) that is less than a default row address to column address delay (tRCD).

Aspect 17: The apparatus of any of aspects 15 through 16 where the second subarray is different than the first subarray and the method, apparatuses, and non-transitory computer-readable medium, further includes operations, features, circuitry, logic, means, or instructions, or any combination thereof for transmitting a read command an amount of time after transmitting the second activation command, the amount of time including a different section index shortened row address to column address delay (tRCD_DS) that is less than a default row address to column address delay (tRCD).

Aspect 18: The apparatus of any of aspects 15 through 17, further including operations, features, circuitry, logic, means, or instructions, or any combination thereof for transmitting, before transmitting the second activation command, a precharge command to close the first row of memory cells.

Aspect 19: The apparatus of aspect 18, further including operations, features, circuitry, logic, means, or instructions, or any combination thereof for the indication is transmitted in the precharge command.

Aspect 20: The apparatus of any of aspects 18 through 19, further including operations, features, circuitry, logic, means, or instructions, or any combination thereof for the second activation command is transmitted before the first row of memory cells in the first subarray of the bank is closed.

Aspect 21: The apparatus of aspect 20, further including operations, features, circuitry, logic, means, or instructions, or any combination thereof for the second activation command is transmitted an amount of time after the precharge command is transmitted, the amount of time including a shortened row precharge time (tRP_S) that is less than a default row precharge time (tRP).

Aspect 22: The apparatus of any of aspects 15 through 21, further including operations, features, circuitry, logic, means, or instructions, or any combination thereof for transmitting a second indication of a third activation command for a third subarray of the bank based at least in part on transmitting the second activation command and before transmitting the third activation command and transmitting the third activation command to open a third row of memory cells in a fourth subarray of the bank, where the third subarray is different than the fourth subarray.

Aspect 23: The apparatus of aspect 22, further including operations, features, circuitry, logic, means, or instructions, or any combination thereof for transmitting a read command an amount of time after transmitting the third activation command, the amount of time including a default row address to column address delay (tRCD).

Aspect 24: The apparatus of any of aspects 15 through 23, further including operations, features, circuitry, logic, means, or instructions, or any combination thereof for the indication is transmitted in the first activation command.

Aspect 25: The apparatus of any of aspects 15 through 24, further including operations, features, circuitry, logic, means, or instructions, or any combination thereof for the indication includes one or more bits indicating a section index, one or more bits indicating a row address, or both.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 26: An apparatus, including: a bank of memory cells including one or more subarrays; and a controller coupled with the bank and configured to cause the apparatus to: receive a first activation command to open a first row of memory cells in a first subarray of the bank; receive an indication of a second activation command for a second subarray of the bank based at least in part on receiving the first activation command and before receiving the second activation command; activate a portion of the second subarray of the bank based at least in part on receiving the indication; and receive the second activation command to open a second row of memory cells in the second subarray of the bank after activating the portion of the second subarray.

Aspect 27: The apparatus of aspect 26, where the second subarray includes the first subarray, the controller further configured to cause the apparatus to: generate, based at least in part on receiving the first activation command, a first set of timing signals to activate the first subarray of the bank; and generate, based at least in part on receiving the indication and before receiving the second activation command, a second set of timing signals to activate the first subarray of the bank.

Aspect 28: The apparatus of aspect 27, where the controller is further configured to cause the apparatus to: receive a read command an amount of time after receiving the second activation command, the amount of time including a same section index shortened row address to column address delay (tRCD_SS) that is less than a default row address to column address delay (tRCD).

Aspect 29: The apparatus of any of aspects 26 through 28, where the second subarray is different than the first subarray, the controller further configured to cause the apparatus to: generate, based at least in part on receiving the first activation command, a first set of timing signals to activate the first subarray of the bank; generate, based at least in part on receiving the indication and before receiving the second activation command, a second set of timing signals to activate the second subarray of the bank.

Aspect 30: The apparatus of aspect 29, where the controller is further configured to cause the apparatus to: receive a read command an amount of time after receiving the second activation command, the amount of time including a different section index shortened row address to column address delay (tRCD_DS) that is less than a default row address to column address delay (tRCD).

Aspect 31: The apparatus of any of aspects 26 through 30, where the controller is further configured to cause the apparatus to: receive, before receiving the second activation command, a precharge command to close the first row of memory cells.

Aspect 32: The apparatus of aspect 31, where the indication is received in the precharge command.

Aspect 33: The apparatus of any of aspects 31 through 32, where the second activation command is received before the first row of memory cells in the first subarray of the bank is closed.

Aspect 34: The apparatus of aspect 33, where the second activation command is received an amount of time after the precharge command is received, the amount of time including a shortened row precharge time (tRP_S) that is less than a default row precharge time (tRP).

Aspect 35: The apparatus of any of aspects 33 through 34, where the controller is further configured to cause the apparatus to: generate, based at least in part on receiving the precharge command, a set of timing signals to close the first row of memory cells; maintain the set of timing signals after receiving the second activation command; and close the first row of memory cells after receiving the second activation command based at least in part on maintaining the set of timing signals.

Aspect 36: The apparatus of any of aspects 26 through 35, where the controller is further configured to cause the apparatus to: receive a second indication of a third activation command for a third subarray of the bank based at least in part on receiving the second activation command and before receiving the third activation command; activate a portion of the third subarray of the bank based at least in part on receiving the third indication; and receive the third activation command to open a third row of memory cells in a fourth subarray of the bank after activating the portion of the third subarray, where the third subarray is different than the fourth subarray.

Aspect 37: The apparatus of aspect 36, where the controller is further configured to cause the apparatus to: receive a read command an amount of time after receiving the third activation command, the amount of time including a default row address to column address delay (tRCD).

Aspect 38: The apparatus of any of aspects 26 through 37, where the indication is received in the first activation command.

Aspect 39: The apparatus of any of aspects 26 through 38, where the indication includes a section index, one or more row address bits, or both.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, and/or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving a first activation command to open a first row of memory cells in a first subarray of a bank of a memory device;
   receiving an indication of a second activation command for a second subarray of the bank based at least in part on receiving the first activation command and before receiving the second activation command;
   activating a portion of the second subarray of the bank based at least in part on receiving the indication; and
   receiving the second activation command to open a second row of memory cells in the second subarray of the bank after activating the portion of the second subarray.

2. The method of claim 1, wherein the second subarray and the first subarray are the same, the method further comprising:
   generating, based at least in part on receiving the first activation command, a first set of timing signals to activate the first subarray of the bank; and
   generating, based at least in part on receiving the indication and before receiving the second activation command, a second set of timing signals to activate the first subarray of the bank.

3. The method of claim 2, further comprising:
   receiving a read command an amount of time after receiving the second activation command, the amount of time comprising a same section index shortened row address to column address delay (tRCD_SS) that is less than a default row address to column address delay (tRCD).

4. The method of claim 1, wherein the second subarray is different than the first subarray, the method further comprising:
   generating, based at least in part on receiving the first activation command, a first set of timing signals to activate the first subarray of the bank; and
   generating, based at least in part on receiving the indication and before receiving the second activation command, a second set of timing signals to activate the second subarray of the bank.

5. The method of claim 4, further comprising:
   receiving a read command an amount of time after receiving the second activation command, the amount of time comprising a different section index shortened row address to column address delay (tRCD_DS) that is less than a default row address to column address delay (tRCD).

6. The method of claim 1, further comprising:
receiving, before receiving the second activation command, a precharge command to close the first row of memory cells.

7. The method of claim 6, wherein the indication is received in the precharge command.

8. The method of claim 6, wherein the second activation command is received before the first row of memory cells in the first subarray of the bank is closed.

9. The method of claim 8, wherein the second activation command is received an amount of time after the precharge command is received, the amount of time comprising a shortened row precharge time (tRP_S) that is less than a default row precharge time (tRP).

10. The method of claim 8, further comprising:
generating, based at least in part on receiving the precharge command, a set of timing signals to close the first row of memory cells;
maintaining the set of timing signals after receiving the second activation command; and
closing the first row of memory cells after receiving the second activation command based at least in part on maintaining the set of timing signals.

11. The method of claim 1, further comprising:
receiving a second indication of a third activation command for a third subarray of the bank based at least in part on receiving the second activation command and before receiving the third activation command;
activating a portion of the third subarray of the bank based at least in part on receiving the second indication; and
receiving the third activation command to open a third row of memory cells in a fourth subarray of the bank after activating the portion of the third subarray, wherein the third subarray is different than the fourth subarray.

12. The method of claim 11, further comprising:
receiving a read command an amount of time after receiving the third activation command, the amount of time comprising a default row address to column address delay (tRCD).

13. The method of claim 1, wherein the indication is received in the first activation command.

14. The method of claim 1, wherein the indication comprises one or more bits indicating a section index, one or more bits indicating a row address, or both.

15. An apparatus, comprising:
a bank of memory cells comprising one or more subarrays; and
a controller coupled with the bank and configured to cause the apparatus to:
receive a first activation command to open a first row of memory cells in a first subarray of the bank;
receive an indication of a second activation command for a second subarray of the bank based at least in part on receiving the first activation command and before receiving the second activation command;
activate a portion of the second subarray of the bank based at least in part on receiving the indication; and
receive the second activation command to open a second row of memory cells in the second subarray of the bank after activating the portion of the second subarray.

* * * * *